United States Patent

Suezawa et al.

[11] Patent Number: 6,074,797
[45] Date of Patent: Jun. 13, 2000

[54] PRECUSOR OF WATERLESS PLANOGRAPHIC PRINTING PLATES

[75] Inventors: Mitsuru Suezawa; Akihiro Iihara; Norimasa Ikeda, all of Shiga, Japan

[73] Assignee: Toray Industries, Inc., Japan

[21] Appl. No.: 09/255,982

[22] Filed: Feb. 23, 1999

[30] Foreign Application Priority Data

Feb. 24, 1998 [JP] Japan .................................. 10-042507
Apr. 24, 1998 [JP] Japan .................................. 10-114511

[51] Int. Cl.[7] .......................... G03F 7/023; G03F 7/075
[52] U.S. Cl. ...................... 430/166; 430/190; 430/303; 101/452; 101/453
[58] Field of Search ............................ 430/166, 190, 430/303; 101/452, 453

[56] References Cited

U.S. PATENT DOCUMENTS

| | | | |
|---|---|---|---|
| 4,853,313 | 8/1989 | Mori et al. | 430/156 |
| 5,223,373 | 6/1993 | Lin et al. | 430/190 |
| 5,252,431 | 10/1993 | Yoshida et al. | 430/303 |
| 5,609,981 | 3/1997 | Hallman et al. | 430/166 |
| 5,866,294 | 2/1999 | Oguni et al. | 430/166 |

FOREIGN PATENT DOCUMENTS

| | | |
|---|---|---|
| 2 064 803 | 6/1981 | United Kingdom . |
| WO 93/06528 | 4/1993 | WIPO . |

*Primary Examiner*—John S. Chu
*Attorney, Agent, or Firm*—Morrison & Foerster, LLP

[57] ABSTRACT

The present invention relates to a precursor of waterless planographic printing plates, in which at least a photosensitive layer and a silicone rubber layer are laminated on a substrate in this order, characterized in that said photosensitive layer contains a quinonediazide group-containing polyurethane resin and furthermore, preferably, contains a light-heat converting material.

The present invention can provide a precursor of waterless planographic printing plates, which is improved in both image reproducibility and printing durability, and which can be applied to both the method of obtaining a waterless planographic printing plate by ordinary image exposure and the method of obtaining a waterless planographic printing plate by laser irradiation.

15 Claims, No Drawings

PRECUSOR OF WATERLESS PLANOGRAPHIC PRINTING PLATES

TECHNICAL FIELD

The present invention relates to a precursor of waterless planographic printing plates, in particular, mainly a negative precursor of waterless planographic printing plates. In more detail, it mainly relates to a negative precursor of waterless planographic printing plates which is remarkably improved in both image reproducibility and printing durability and which can be used for both the method of obtaining a waterless planographic printing plate by ordinary exposure and the method of obtaining a waterless planographic printing plate by laser irradiation.

BACKGROUND ARTS

Printing plates using an ink repellent layer such as a silicone rubber layer or a fluorine resin layer without using any dampening water, especially photosensitive planographic printing plates obtained by selective exposure and development have been variously proposed.

The waterless printing refers to a printing method which allows printing without using any dampening water by letting the image area and the non-image area exist basically on almost the same plane, with an ink receiving layer formed on the image area and an ink repellent layer formed on the non-image area for allowing the ink to be formed on the image area only by using the difference of both the areas in ink receptability, and by transferring the ink formed on the image area onto a printing medium such as paper. Usually the non-image area is formed by an ink repellent substance such as silicone rubber or fluorine resin, etc.

For example, proposed positive precursors for waterless planographic printing plates include a precursor of waterless planographic printing plates with a photopolymerizable photosensitive layer and a silicone rubber layer as an ink repellent layer formed on a substrate and a precursor of waterless planographic printing plates with a photodimerizable photosensitive layer and a silicone rubber as an ink repellent layer laminated on a substrate. As a negative precursor of waterless printing plates, JP-B-61-54222, etc. propose a precursor of waterless planographic printing plates in which a photoreleasable photosensitive layer obtained by crosslinking a partial esterification product of 1,2-naphthoquinone-2-diazido-5-sulfonic acid chloride and phenol formaldehyde novolak resin by a polyfunctional isocyanate is laminated on a substrate, with a silicone rubber layer as an ink repellent layer laminated further on it. A precursor of waterless planographic printing plates in which a fluorine resin using 1H,1H,2H,2H-heptodecafluorodecyl methacrylate is used as an ink repellent layer instead of a silicone rubber layer is also known.

Any of these precursors for waterless printing plates is exposed to active light through a positive film when the precursor is positive, or through a negative film when the precursor is negative. In the subsequent development treatment, the ink repellent layer is removed only at the area corresponding to the image area to expose the photosensitive layer or the substrate below it as the case may be, for forming the image area where ink can be formed. Usually in the case of a positive precursor of waterless planographic printing plates, the ink repellent layer is removed at the non-exposed area, to form the image area where ink can be formed, and in the case of a negative precursor of waterless planographic printing plates, the ink repellent layer is removed at the exposed area, to form the image area.

Among the above precursors for waterless planographic printing plates, as a photoreactive compound used in the photosensitive layer of a precursor of waterless planographic printing plates, for example, JP-B-61-616, etc. disclose a phenol formaldehyde novolak resin having quinonediazide groups. As another photoreactive compound, for example, an acetone pyrogallol resin having quinonediazide groups, etc. is also preferably used. However, all of quinonediazide groups, phenol formaldehyde novolak resin and acetone pyrogallol resin are structurally rigid, and make the entire photosensitive layer rigid. So in mass printing, it happens that the photosensitive layer is simply destroyed, and as a result, that in the non-image area, the photosensitive layer falls off together with the ink repellent layer formed on it. If the ink repellent layer falls off, printing cannot be continued further. For this reason, the conventional negative precursors for waterless planographic printing plates are said to have a problem in printing durability.

To improve the printing durability, various studies have been made. For example, JP-A-8-69110 proposes a waterless planographic printing plate using a compound with quinoneazide added to a low molecular compound having a specific structure for making the quinonediazide compound itself flexible in the photosensitive layer, but the compound has a problem that the film formability is not sufficient.

JP-A-8-76368 proposes a waterless planographic printing plate using a photosensitive layer containing a quinonediazide compound and a binder resin such as a polyurethane for making the photosensitive layer flexible. However, the mixture consisting of a quinonediazide compound and a polyurethane is poor in compatibility, being likely to form an islands-in-sea structure, though the waterless planographic printing plate obtained is excellent in printing durability since the photosensitive layer is flexible. If the photosensitive layer has an islands-in-sea structure, each halftone is deformed though halftone dots can be reproduced, and it is difficult to obtain the intended color tone in the prints obtained.

JP-A-7-43895 and U.S. Pat. No. 5,631,119 propose an image forming material, the photosensitive layer of which contains an o-quinonediazide compound and an additive capable of reacting with the photoreaction product of the o-quinonediazide compound by heating to form an alkali insoluble substance, and has a water soluble high polymer layer or furthermore a silicone rubber layer formed on it in this order. This image forming material is exposed on the entire surface to active light, heated or irradiated using a thermal head or laser beam in the form of an image, and developed using an alkaline developer to remove the silicone rubber layer in the non-heated area or the non-irradiated area as well as the photosensitive layer. In this method, since the entire photosensitive layer is removed together with the silicone rubber layer, image reproducibility is low. Furthermore since the halftone cells are deep, it is difficult to fill the entire cells with the printing ink, and especially the image reproduction at the highlighted area becomes disadvantageously difficult.

The present invention overcomes the disadvantages of these prior arts by providing a precursor of waterless printing plates, which is remarkably improved in both image reproducibility and printing durability without being lowered in developability, printability, solvent resistance, etc., by letting the photosensitive layer contain a polyurethane having quinonediazide groups, and which can be used for both the method of obtaining a waterless planographic printing plate by ordinary exposure and the method of obtaining a waterless planographic printing plate by laser irradiation, by letting the photosensitive layer further contain a light-heat converting material.

DISCLOSURE OF THE INVENTION

The object of the present invention can be achieved by:

a precursor of waterless planographic printing plates, in which at least a photosensitive layer and a silicone rubber layer are laminated in this order on a substrate, characterized in that said photosensitive layer contains a quinonediazide group-containing polyurethane resin;

preferably, said precursor of waterless planographic printing plates, in which said photosensitive layer contains a quinonediazide compound in addition to said quinonediazide group-containing polyurethane resin, more preferably, said precursor of waterless planographic printing plates, in which the quinonediazide compound is a quinonediazide group-containing phenol formaldehyde novolak resin or a quinonediazide group-containing acetone pyrogallol resin, further more preferably, said precursor of waterless planographic printing plates, in which said photosensitive layer contains a quinonediazide compound and a light-heat converting material.

THE BEST EMBODIMENTS OF THE INVENTION

The constitution of the present invention is described below more specifically.

In the present invention, the quinonediazide group-containing polyurethane resin used in the photosensitive layer can be a substance obtained by letting a quinonediazide compound react with a polyurethane obtained from any of the following polyisocyanates and any of the following polyhydric alcohols. The isocyanates include paraphenylene diisocyanate, tolylene diisocyanate (TDI), xylylene diisocyanate, (XDI), hexamethylene diisocyanate (HMDI), lysbiue diisocyanate (LDI), isophorone diisocyanate (IPDI), trimethylhexamethyleize diisocyanate (TMDI), etc., polyalcohol adducts of polyisocyanates, polymers of polyisocyanates, etc.

The polyhydric alcohols include ethylene glycol, propylene glycol, 1,4-butanediol, diethylene glycol, glycerol, trimethylolpropane, pentaerythritol, sorbitol, etc.

If the obtained polyurethane has hydroxyl groups or amino groups at the ends, o-naphthoquinone- and benzoquinone-diazidosulfonic acid halides can be caused to directly react with it, for obtaining a quinonediazide group-containing polyurethane resin.

The o-naphthoquinone- and benzoquinone-diazidosulfonic acid halides include 1,2-naphthoquinone-2-diazido-4- or -5-sulfonic acid chloride, 1,2-naphthoquinone-2-diazido-4- or -5-sulfonic acid fluoride, 1,2-naphthoquinone-2-dizido-4- or -5-sulfonic acid bromide, 1,2-benzoquinone-2-diazido-4- or -5-sulfomic acid chloride, 1,2-benzoquinone-2-diazido-4- or -5-sulfonic acid fluoride, 1,2-benzoquinone-2-diazido-4- or -5-sulfonic acid bromide, etc.

If the obtained polyurethane has isocyanate groups at the ends, the quinonediazide group-containing polyurethane resin can be obtained by letting a diol compound, a diamine compound, or a dithiol compound react with the isocyanate groups at the ends, and letting said o-naphthoquinone- and benzoquinone-diazidosulfonic acid halides react the reaction product, or reversely by letting a diol compound, a diamine compound, or a dithiol compound react with the o-naphthoquinone- and benzoquinone-diazidosulfonic acid halides and letting the reaction product react with the end isocyanate groups of the polyurethane.

In the present invention, the quinonediazide compounds which can be used in the photosensitive layer include known high molecular and low molecular quinonediazides, for example, preferably o-naphthoquinonediazidosulfonic acid esters or o-naphthoquinonediazidocarboxylic acid esters of aromatic hydroxy compounds, and o-naphthoquinonediazidosulfonic acid amides or o-naphthoquinonediazidocarboxylic acid amides of aromatic amine compounds, more specifically the ester (hereinafter an ester can also be a partial ester) of benzoquinone-1,2-diazidosulfonic acid or naphthoquinonediazido-1,2-diazido-sulfonic acid and polyhydroxyphenyl, 1,2-naphthoquinone-2-diazido-4- or -5-sulfonic acid esters of phenol formaldehyde novolak resin, resol resin, resorcin benzaldehyde condensation resin, acetone pyrogallol resin, homopolymer and copolymers of hydroxystyrene, etc., 1,2-naphthoquinone-2-diazido-4- or -5-sulfonic acid ester with polyethylene glycol, amides of a polyamine and 1,2-naphthoquinone-2-diazido4- or -5-sulfonic acid, 1,2-naphthoquinone-2-diazido-4- or -5-sulfoinic acid ester with p-hydroxyanilide polymethacrylate, amide of amine-modified natural resin rosin and 1,2-naphthoquinone-2-diazido-4- or -5-sulfonic acid, 1,2-naphthoquinone-2-diazido-4- or -5-sulfonic acid ester with an epoxy resin obtained from bisphenol A and propylene oxide, 1,2-naphthoquinone-2-diazidoA4- or -5-sulfonic acid ester with the polymer obtained from (meth) acrylic acid and dihydroxyphenyl monoester, 1,2-naphthoquinone-2-diazido-4- or -5-sulfonic acid ester with bisphenol A, polymer of the condensation product of diallyl aminoisophthalate and naphthoquinonediazidosulfonic acid, quinonediazidosulfonic acid ester with a polycarbonate, esters of 1,2-naphthoquinone-2-diazido-5-sulfonic acid and a phenol such as phenol or p-cresol or an alcohol such as ethyl alcohol, propyl alcohol, butyl alcohol or amyl alcohol, acid amides of 1,2-naphthoquinone-2-diazido-5-sulfonic acid and an amine such as aniline or p-hydroxyaniline, etc.

Among them, phenol formaldehyde novolak resin, resol resin, acetorne pyrogallol resin, etc. are preferable. Especially 1,2-naphthoquinone-2-diazido-5-sulfonic acid esters of phenol formaldehyde novolak resin and acetone, pyrogallol resin are preferable.

Furthermore, 1,2-naphthoquinone-2-diazido-5-sulfonic acid ester of phenol formaldehyde novolak resin with 5 to 75% of its hydroxyl groups esterified and 1,2-naphthoquinone-2-diazido-5-sulfonic acid ester of acetone pyrogallol resin with 5 to 70% of its hydroxyl groups esterified are more preferable.

In the present invention, as a quinonediazide compound other than the above, a quinonediazide compound with at least one of the structures represented by the following general formula (I) (silyl group-containing quinonediazide compound) can also be used.

$$—SiRnX_{3-n} \qquad (I)$$

(where n stands for an integer of 0 to 3; R stands for an alkyl group, alkenyl group, aryl group or any of their combinations, respectively with or without a functional group such as halogen atom, isocyanate group, epoxy group, amino group, hydroxy group, alkoxy group, aryloxy group, (meth)acryloxy group or mercapto group, etc. as a substituent group; X stands for a functional group such as hydrogen atom, hydroxyl group, alkoxy group, acyloxy group, ketoxime group, amide group, aminoxy group, amino group or alkenyloxy group, etc.)

The silyl group-containing quinonediazide compound can be obtained by (1) letting a silyl group-containing compound react with a quinonediazide compound,
(2) letting the silyl group-containing quinonediazide compound obtained as above react with a compound containing phenolic hydroxyl groups such as novolalk resin,
(3) letting a silyl group-containing compound with a compound having a hydroxyl group, etc., and letting a quinonediazide compound further react with the reaction product, or
(4) modifying the silyl group-containing quinonediazide compound obtained by any of the above methods, etc.

Among the above methods, a silyl group-containing quinonediazicle compound obtained by (1) letting a silyl group-containing compound react with a quinonediazide compound is preferable.

The structures represented by the general formula (I) include alkoxysilyl group, acetoxysilyl group, oximesilyl group, trialkylsiloxy group, triphenylsiloicy group, etc. Among them, alkoxysilyl group, acetoxysilyl group and oximesilyl group are preferable.

The silyl group-containing compounds which can be used to introduce any of the structures represented by said general formula (I) into a quinonediazide compound include known alkoxysilanes, acetoxysilanes, oximesilanes, amidosilanes, etc. Among these silyl group-containing compounds, reactive group-containing silyl compounds are preferable. Reactive alkyl group-containing silyl compounds include chloroalkylsilyl compounds, epoxyalkylsilyl compounds, isocyanatoalkylsilyl compounds, methacryloxyalkylsilyl compounds, acryloxyalkylsilyl compounds, vinyl ester silyl compounds, aminoalkylsilyl compounds, alkenylsilyl compounds, etc.

Among them, epoxyacrylsilyl compounds and isocyanatoalkylsilyl compounds are preferable. Furthermore, isocyanatoalkylsilyl compounds are more preferable.

The isocyanatoalkylsilyl compounds include 3-isocyanatopropyltriethoxy-silane, 3-isocyanatopropyldimethylchlorosilane, 3-isocyanatopropyltrimethoxysilane, etc.

Any of these silyl group-containing compounds and a quinonediazide compound can be caused to react with each other, to obtain a silyl group-containing quinonediazide compound.

The quinonediazide compounds which can be caused to react with the silyl group-containing compound include benzoquinonediazidosulfonic acid and its derivatives, naphthoquinonediazidosulfonic acid and its derivatives, etc., though not limited to them. Among them, naphthoquinonediazidosulfonic acid derivatives are preferable.

They include 1,2-naphthoquinone-2-diazido-4- and/or -5-sulfonic acid esters of phenol formaldehyde novolak resin (obtained by condensing a phenol such as phenol, p-tert-butylphenol, p-octylphenol, p-nonylphenol, cresol, xylenol, catechol and pyrogallol and a formaldehyde in the presence of an acid catalyst), resol resin (for example, obtained by condensing any of said phenols and a formaldehyde in the presence of an alkaline catalyst), resorcin benzaldehyde condensation resin, acetone pyrogallol resin, homopolymer or copolymer of hydroxystyrene, etc. Among them, phenol formaldehyde novolak resin is preferable.

A compound obtained by letting a silyl group-containing compound, preferably a reactive alkyl group-containing silyl compound, more preferably an isocyanatoalkylsilyl compound react with the 1,2-naphthoquinone-2-diazido-5-sulfonic acid ester of phenol formaldehyde novolak resin is a preferable silyl group-containing quinonediazide compound.

Any of the above silyl group-containing quinonediazide compounds can be used alone or as a mixture with another quinonediazide compound having silyl groups.

It is preferable that the amount of the above mentioned quinonediazide compound in the photosensitive layer is 10 wt % to 95 wt %. A more preferable range is 15 wt % to 90 wt %, and a further more preferable range is 20 wt % to 80 wt %. If the amount in the photosensitive layer is too small, the capability to manifest the image reproducibility is insufficient, and if too large on the contrary, the photosensitive layer becomes hard and fragile, without allowing good printing durability to be achieved.

The active light of 500 to 1300 nm used in the present invention can be applied by a semiconductor laser, Ti sapphire laser, N laser, ruby laser and as stated in JP-B-57-3507, an Ar ion laser, Kr ion laser, He—Ne laser, He—Cd laser, Ga—As, laser, YAG—$Nd^{3+}$ laser, glass-$Nd^{3+}$ laser, CO laser, etc. Among them, a semicondustor laser is preferable since, by recent improvement, it is compact and economical.

The light-heat converting material used in the present invention can be carbon black or dye, etc.

The carbon black used in the present invention can be classified as specified in ASTM, and also classified, in reference to applications, into the carbon black for color, that for rubber, that for dry battery, etc., and also classified, in reference to production methods, into furnace black, channel black, thermal black, acetylene black, lamp black, etc. Any carbon black can be used as far as it can be mixed stably. Among them, furnace black is preferable since various types in view of grain size, etc. are being marketed and since it is commercially available at low cost.

The carbon black can be dispersed by any known dispersion technique as used for ink production, toner production, etc. The dispersing machines which can be used here include an ultrasonic dispersing machine, sand mill, attriter, super mill, ball mill, impeller, disperser, KD mill, colloid mill, Dynatron, three-roll mill, pressure kneader, etc. Details are stated in "The Latest Pigment Application Techniques (in Japanese)" (CMC Shuppan, 1986). For easier dispersion, color chips or collar paste, etc. with carbon black dispersed in a binder resin beforehand can also be used.

It is preferable that the amount of carbon black used in the photosensitive layer in the present invention is 1 to 30 wt %. A more preferable range is 1 to 20 wt %, and an especially preferable range is 1 to 15 wt %. If the amount is in this range, the laser light absorption efficiency can be good, and the image reproducibility can be excellent. On the other hand, the photosensitive layer can be kept flexible and resiliency-restorable, to improve printing durability.

The dyes which can be used in the present invention include those with the maximum absorption wavelength in a range of 400 nm to 1200 nm, specifically those for electronics and recording, such as acid dyes, basic dyes, coloring matters and oil soluble dyes based on cyanine, phthalocyanine, phthalocyanine metal complex, naphthalocyanine, naphthalocyanine metal complex, dithiol metal complex, naphthoquinone, anthraquinone, indophenol, indoaniline, pyryliurm, thiopyrylium, squarilium, croconium, diphenylmethane, triphenylmethane, triphenylmethanephthalide, triarylmethane, phenothiazine, phenoxazine, fluoran, thiofluorene, xanthene, indolylphthalide, spiropyran, azaphthalide, chromenopyrazole, Leuco Auramine, Rhodamine Lactam, quinazoline, diazaxanthene, bislactone, fluorenone, monoazo, ketoneimine, disazo, methine, polymethine, bisazo, bisazostilbene, bisazoxaziazol, bisazofluorenone, bisazohydroxyperinone, azochrome complex salt, trisazotriphenylamine, thioindigo, perylene, nitroso, 1:2 metal complex salt, intermolecular CT, quinoline, monophthalone and fulgide, triphenylmethane based leuco dyes, cation dyes, azo based disperse dyes, benzothiopyran based spiropyran, 3,9-dibromoanthoanthroine, indanthrone, phenolphthalein, sulfophthalein, Ethyl Violet, Methyl Orange, fluorescein, methylviologen, Methylene Blue, dimroth betaine, etc.

Furthermore, couplers, azo dye developers, anthraquinone dye developers, dye releasing agents and bisazo dyes for color photography, Erythrocin, Rose Bengale, Eosine Y, Rhodamine B, Thionine, etc. can also be used.

Furthermore, black dyes called Acid Fast Black, Acid Black (excluding Acid Black 2), Direct Black, Basic Black, Mordant Black, Azoic Black, Vat Black, Disperse Black, Reactive Black, Chrome Black and Solvent Black (excluding Solvent Black 5 and 7) as color index names can also be used.

The black dyes include all the dyes called black in color index name.

Among them, dyes for electronics and recording with the maximum absorption wavelength in a range of 700 nm to 900 nm, i.e., infrared or near infrared absorbing dyes such as cyanine based dyes, azulenium based dyes, squarilium based dyes, croconium based dyes, azo based disperse dyes, bisazostilbene based dyes, naphthoquinone based dyes, anthraquinone based dyes, perylene based dyes, phthalocyanine based dyes, napthalocyanine metal complex based dyes, dithiol nickel complex based dyes, indoaniline metal complex based dyes, intermolecular CT dyes and benzothiopyran based spiropyran are more preferable.

Among these dyes, those large in molar absorption coefficient can be more preferably used. Specifically those of $e=1\times10^4$ or more, especially $e=1\times10^5$ or more are preferable. If the molar absorption coefficient is in this range, the effect of sensitivity improvement is likely to be manifested.

It is preferable that the amount of the dye used in the photosensitive layer in the present invention is 1 to 40 wt %. A more preferable range is 1 to 20 wt %, and an especially preferable range is 1 to 15 wt %. If the amount is in this range, the laser light absorption efficiency is good, and the image reproducibility improves. On the other hand, the photosensitive layer can be kept flexible and resiliency-restorable, to improve printing durability.

Using any one of the above light-heat converting materials is effective, but if two or more of them are used together, the effect can be further improved.

In the present invention, a nigrosine can also be used as the dye.

The nigrosines which can be used in the present invention include C.I 50415 (C.1 Solvent Black 5), C.I 50415B (C.I Solvent Black 7), C.I 50420 (C.I Acid Black 2), etc. as stated in COLOUR INDEX Second Edition.

More specifically, the C.I 50415 can be Nigrosine BSS, Nigrosine LSP Spirit Soluble, Nigrosine SSB, Nigrosine Spirit Soluble, Spirit Nigrosine B, Spirit Nigrosine NB, Spirit Nigrosine SSB, Spirit Soluble Nigrosine, etc. The C.I 50415B can be Black Base BB, Nigrosine V, Nigrosine Base CAC, Nigrosine Base CCC, Nigrosine Base CV, Nigrosine Base B, Nigrosine Base N, Nigrosine Base R, Nigrosine Base 2R, Nigrosine Base NB, Fat Black CD, Fat Black IW, Oil Black OA, Sealing Black AF, etc. The C.I 50420 can be Orient Nigrosine BR, Orient Nigrosine OZ, Nigrosine NB, Nigrosine AK, Nigrosine B, Nigrosine K, Nigrosine R, Nigrosine SR, Nigrosine G, Nigrosine FS, Nigrosine L, Nigrosine W, Nigrosine WZ, Nigrosine Z, Nigrosine WSB, Nigrosine WSJ, Nigrosine BS, Nigrosine XX, Nigrosine Blue L, Water Nigrosine W, Water Soluble Nigrosine, etc. The nigrosines which can be used in the present invention are not limited to those enumerated here.

It is preferable that the amount of the nigrosine used in the photosensitive layer in the present invention is 1 to 40 wt %. A more preferable range is 1 to 20 wt %, and an especially preferable range is 1 to 15 wt %. If the amount used is in this range, the laser light absorption efficiency is good, and the image reproducibility is excellent. On the other hand, the photosensitive layer can be kept flexible and resiliency-restorable, to improve printing durability.

A methine or polymethine can also be used as the dye in the present invention.

The methines and polymethines which can be used in the present invention include C.I 48000 (C.I Disperse Yellow 31), C.I 48001 (C.I Disperse Dye), C.I 48005 (C.I Disperse Dye), C.I 48010 (C.I Basic Dye), C.I 40813 (Dye for Lakes), C.I 48015 (C.I Basic Red 13), C.I 48020 (C.I Basic Violet 7), C.I 48025 (Basic Dye), C.I 48030 (Basic Dye), C.I 48035 (C.I Basic Orange 21), C.I 48040 (C.I Basic Orange 22), C.I 48045 (Solvent Dye), C.I 48050 (Disperse Dye), C.I 48055 (C.I Basic Yellow 11), C.I 48060 (Dye for Lakes), C.K 48065 (C.I Basic Yellow 12), C.I 48070 (C.I Basic Red 12), C.I 48075 (Basic Dye), C.I 48080 (Basic Dye), etc. as enumerated in COLOUR INDEX Section Edition. The methines and polymethines which can be used in the present invention are not limited those enumerated here.

It is preferable that the amount of the methine or polymethine used in the photosensitive layer in the present invention is 1 to 40 wt %. A more preferable range is 1 to 20 wt %, and an especially preferable range is 1 to 15 wt %. If the amount is in this range, the laser light absorption efficiency can be good and the image reproducibility can be excellent. On the other hand, the photosensitive layer can be kept flexible and resiliency-restorable, to improve printing durability.

To further improve the adding effect of the light-heat converting material, it is preferable to add additives, for example, a black pigment such as aniline black or cyanine black, green pigment such as phthalocyanine or naphthalocyanine, metal oxide such as titanium oxide, vanadium oxide, manganese oxide, iron oxide, cobalt oxide or tungsten oxide, hydroxide of any of these metals, sulfate of any of these metals, metal powder of bismuth, tin or tellurium, etc.

It is preferable that the amount of these additives used in the photosensitive layer is 1 to 40 wt %. A more preferable range is 1 to 20 wt %, and an especially preferable range is 1 to 15 wt %. If the amount is in this range, the laser light absorption efficiency can be good and the image reproducibility improves. On the other hand, the photosensitive layer can be kept flexible and resiliency-restorable, to improve printing durability.

As for the tension properties of the photosensitive layer after exposure, it is important the initial elastic modulus is 5 kgf/mm$^2$ to 75 kgf/mm$^2$. A preferable range is 5 kgf/mm$^2$ to less than 50 kgf/mm$^2$, and a further more preferable range is 5 kgf/mm$^2$ to less than 40 kgf/mm$^2$. If the elastic modulus is less than 5 kgf/mm$^2$, the photosensitive layer may be sticky, and picking is likely to be caused during printing. On the contrary, if more than 75 kgf/mm², it is difficult to obtain good printing durability.

It is also preferable that the elongation at breakage is 5% or more. More preferable is 10% or more, and further more preferable is 15% or more. If the elongation at breakage is less than 5%, the photosensitive layer may be fragile, and in the case of offset printing, the photosensitive layer may be destroyed, and it is hard to achieve high printing durability.

The binder resin which can keep the form of the photosensitive layer in the present invention can be any polymer which is soluble in an organic solvent and can form a film. Preferable is a homopolymer or copolymer with a glass transition temperature (Tg) of 0° C. or lower.

Typical polymers which can be used as the binder resin are enumerated below, but the binder resin which can be used in the present invention is not limited to them.

(1) Vinyl Polymers

Homopolymers and copolymers obtained from the following monomers and their derivatives.

For example, ethylene, propylene, styrene, butadiene, isoprene, vinyl chloride, vinyl acetate, esters of acrylic acid or methacrylic acid and various alcohols, polypropylene glycol mono(meth)acrylate, acrylamide, N-methylolacrylamicle, glycidyl methacrylate, acrylonitrile, isobutene, polyethylene glycol di(meth)acrylate, compound obtained by (meth)acrylating the addition product of ethylene oxide or propylene oxide to a polyfunctional alcohol such as glycerol or trimethylolpropane.

(2) Unvulcanized Rubbers

Homopolymers and copolymers selected from natural rubber (NR) and known unsaturated double bond-containing compounds, such as polybutadiene (BR), styrene-butadiene copolymer (SBR), acrylate-acrylonitrile copolymers (ANM), acrylonitrile-butadiene copolymer (NBR), ethylene-propylene copolymer (EPM, EPDM), etc.

(3) Polyoxides (polyethers)

Homopolymers and copolymers obtained by ring-opening polymerization of trioxane, ethylene oxide, propylene oxide, 2,3-epoxybutane, 3,4-epoxybutene, epoxycyclohexane, styrene oxide, epichlorohydrin, phenyl glycidyl ether, etc. can also be used as binder resins.

(4) Polyesters

Polyesters obtained by polycondensation of any of the following polyhydric alcohols and any of the following polycarboxylic acids, polyesters obtained by polymerization of any of the following polyhydric alcohols and any of the following polycarboxylic anhydrides, polyesters obtained by ring-opening polymerization, etc. of lactones, polyesters obtained from the mixtures of these polyhydric alcohols, polycarboxylic acids, polycarboxylic anhydrides and lactones, etc. can also be used as binder resins.

The polyhydric alcohols include ethylene glycol, propylene glycol, 1,4-butanediol, diethylene glycol, glycerol, trimethylolpropane, pentaerythritol, sorbitol, etc.

The polycarboxylic acids and polycarboxylic anhydrides include phthalic anhydride, isophthalic acid, terephthalic acid, succinic anhydride, adipic acid, sebacic acid, maleic anhydride, fumaric acid, itaconic acid, trimellitic anhydride, etc.

The lactones include β-propiolactone, γ-butyrolactone, ε-caprolactone, etc.

(5) Polyurethanes

Polyurethanes obtained from any of the following polyisocyanates and any of the following polyhydric alcohols can also be used as binder resins. The polyhydric alcohols include those enumerated for the above polyesters, condensation polyester polyols with hydroxyl groups at both the ends obtained by polycondensation of any of these polyhydric alcohols and any of the polycarboxylic acids enumerated for the above polyesters, polyester polyols obtained from the above lactones, polycarbonate diols, polyether polyols used for ring-opening polymerization of propylene oxide and tetrahydrofuran or modification of epoxy resins, acrylic polyols obtained as copolymers of an acrylic (or methacrylic) monomer with a hydroxyl group and an acrylate (methacrylate), polybutadiclne polyols, etc.

The isocyanates include paraphenylene diisocyanate, tolylene diisocyanate (TDI), xylylene diisocyanate (XDI), hexamethylene diisocyanate (HMDI), lysine diisocyanate (LDI), isophorone diisocyanate (IPDI), trimethylhexamethylene diisocyanate (TMDI), etc., polyhydric alcohol adducts of polyisocyanates, polymers of polyisocyanates, etc.

(6) Polyamides

Conventionally proposed polyamides can also be used as binder resins. Basic compositions are copolymers of the following monomers; ε-caprolactam, ω-laurolactam, ω-aminoundecanoic acid, hexamethylenediamine, 4,4'-bis-aminocyclohexylmethane, 2,4,4-trimethylhexamethylenediamine, isophorone-diamine, diglycollic acid, isophthalic acid, adipic acid, sebacic acid, etc.

These polymers which can be binder resins can be used alone or several of these polymers can also be used as a mixture.

Among these binder resins, polyurethanes, vinyl based compound copolymers and polyamides are preferable.

The preferable amount of the binder resin used can be any amount as far as the photosensitive layer has image reproducibility. It is preferable that the amount is 10 to 90 wt % based on the weight of the ingredients of the photosensitive layer. A more preferable range is 10 to 80 wt %, and the most preferable range is 10 to 70 wt %. If the amount of the binder resin is less than 10 wt %, it is difficult to manifest satisfactory photosensitive physical properties. On the other hand, if more than 90 wt %, the amount of the quinonediazide compound decreases as a result, to cause problems in image reproducibility, developability, bonding strength at the interface between the silicone layer and the photosensitive layer.

The present invention can be applied to either a photo-dissolvable photosensitive layer or a photo-releasable photosensitive layer. The photo-dissolvable photosensitive layer refers to a photosensitive layer which is changed in solvent resistance by exposure, and mostly or wholly removed in the exposed area together with the silicone rubber layer as the ink repellent layer by the subsequent development, to form an image area.

On the other hand, the photo-releasable photosensitive layer refers to a photosensitive layer which has the ink repellent layer on it removed by development without being substantially removed in the exposed area, and in the present invention, the photo-releasable photosensitive layer can be preferably used.

To make the photosensitive layer slightly soluble or insoluble in the developer, a modifying means such as crosslinking by a known polyfunctional compound or binding the active groups in the quinonediazide compound to a polyfunctional compound can also be used.

The polyfunctional compounds used for introducing a crosslinked structure include the following polyfunctional isocyanates, polyfunctional epoxy compouncls, etc., though not limited to them.

The polyfunctional isocyanates include those enumerated for preparing said polyurethanes.

The polyfunctional epoxy compounds include polyethylene glycol diglycidyl ethers, polypropylene glycol diglycidyl ethers, bisphenol A diglycidyl ether, trimethylolpropane triglycidyl ether, etc., though not limited to them.

Among them, a polyfunctional isocyanate compound is preferable. It is preferable that the amount of the polyfunctional compound used is 1 to 150 parts by weight per 100 parts by weight of the photosensitive compound. A more preferable range is 5 to 100 parts by weight, and a further more preferable range is 10 to 50 parts by weight.

In addition to the above respective ingredients, as required, additives such as a photosensitizer, acid, base, dye, pigment, photo-coupler, surfactant and catalyst can be added.

The proper thickness of the photosensitive layer is 0.1 to 100 μm. A preferable range is 0.3 to 10 μm. If the thickness is too small, pinholes are likely to be formed in the photosensitive layer, and on the other hand, if too large, it is economically disadvantageous.

The substrate used in the present invention can be any substrate used in or proposed for ordinary waterless planographic printing plates. A substrate which has flexibility to allow setting on a planographic press and can withstand the load applied during printing can be sufficiently used. Usually, a metallic sheet, plastic sheet, rubber sheet or any of various coated paper sheets, etc. can be used. Above all, a metallic sheet, especially a metallic sheet using aluminum can be preferably used.

To obtain sufficient adhesiveness between a photosensitive layer and a substrate, a primer layer can also be formed on the substrate. As the primer layer, any of various conventionally proposed primer layers can be used.

In view of composition, a primer layer containing a natural high polymer, a primer layer using a flexible polyurethane, a primer layer containing an epoxy resin as an ingredient, etc. are known.

In view of setting method, a thermosetting primer layer, a photosetting primer layer, etc. are known. Among photosetting primers, a photo-dimerizable primer, a photo-crosslinkable primer containing a diazo resin, and a photo-polymerizable primer containing an ethylenic unsaturated compound can also be used in the present invention.

The thickness of the primer layer is selected in a range of 0.1 to 100 μm. A preferable range is 0.3 to 50 μm, and a more preferable range is 0.5 to 30 μm. If the thickness is too small, the effect of blocking form defects on the surface of the substrate and chemical adverse effects is poor, and on the other hand, if too large, it is economically disadvantageous.

As the ink repellent layer used in the present invention, a layer using; a silicone rubber can be preferably used, and either condensation type or addition trpe can be used.

A condensation type silicone rubber layer can be prepared from a mixture mainly consisting of an organic polysiloxane with a molecular weight of thousands to hundreds of thousands represented by the following general formula (II) and a crosslinking agent represented by the following general formula (III).

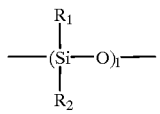

(II)

(where 1 stands for an integer of 2 or more; $R_1$ and $R_2$ stand for, respectively independently, at least one selected from a group consisting of substituted or non-substituted alkyl groups with 1 to 20 carbon atoms, substituted or non-substituted alkenyl groups with 2 to 20 carbon atoms and substituted or non-substituted aryl groups with 4 to 20 carbon atoms; it is preferable that 40% or less of all the groups of $R_1$ and $R_2$ consist of vinyl groups, phenyl groups, vinyl halide groups, phenyl halide groups, and that 60% or more of all the groups consist of methyl groups)

$$R_m SiX_{4-m} \quad (III)$$

(where m stands for an integer of 0 to 2; R stands for an alkyl group, alkenyl group, aryl group or any of their combinations, with or without a functional group such as halogen atom, amino group, hydroxy group, alkoxy group, aryloxy group, (meth)acryloxy group or thiol group as a substituent group; X stands for a functional group such as hydrogen atom, hydroxyl group, alkoxy group, ketoxime group, amide group, aminoxy group, amino group or alkenyloxy group)

As the linear organic polysiloxane, an ordinary linear organic polysiloxane or that with hydroxyl groups at the ends can be preferably used.

The crosslinking agents which can be used here include polyfunctional silane compounds used for room temperature (low temperature) setting silicone rubbers, for example, acetoxysilanes, ketoximesilanes, alkoxysilanes, aminosilanes, amidosilanes, etc. having a trimethoxysilyl group, amino group, glycidyl group, methacrylic group, allyl group or vinyl group, though not limited to them.

If any of these crosslinking agents is combined with any of said linear organic polysiloxanes, an acetic acid removed, oxime removed, alcohol removed, amine removed or amide removed silicone rubber, etc. can be obtained respectively.

For a silicone rubber to be crosslinked with condensation, a known catalyst such as a metal carboxylate can be added.

It is also possible to harden a linear organic polysiloxane into a silicone rubber using a radical initiator.

For the ink repellent layer, an addition type silicone rubber crosslinked by the addition reaction between SiH groups and —CH=CH— groups is also useful. The addition type silicone rubber used here can be obtained by the reaction between a polyvalent hydrogen organopolysiloxane and a polysiloxane compound with two or more —CH=CH— bonds per molecule, and is desirably obtained by crosslinking and hardening a composition consisting of the following ingredients:

(1) a polyorganosiloxane with at least two alkenyl groups (desirably vinyl groups) directly bonded to silicon atoms per molecule, (2) a polyorganosiloxane with at least two SiH bonds per molecule, and (3) an addition catalyst.

In addition to these compositions, it is allowed to add a known adhesive such as an alkenyltrialkoxysilane, or to add a hydroxyl group-containing organopolysiloxane as a composition for a condensation silicone rubber layer, a silicone oil composed of a dimethylpolysiloxane with trimethylsilyl groups at the ends, a dimethylpolysiloxane with trimethylsilyl groups at the ends or hydrolyzable functional group-containing silane (or siloxane).

The proper thickness of the silicone rubber layer is about 0.5 to 100 μm. A preferable range is about 0.5 to 10 μm. If the thickness is too small, the printing durability and the ink repellency may be poor. If too large on the other hand, it is economically disadvantageous, and it becomes difficult to remove the silicone rubber layer at the time of development, lowering the image reproducibility.

In the precursor of waterless planographic printing plates composed as described above, a protective film can be laminated to protect the silicone rubber layer on the surface and to improve the vacuum contact with the film in the step of exposure, or a polymer coating film capable of being dissolved in the developing solution stated in JP-A-5-323588 can also be formed.

The precursor of waterless planographic printing plates obtained like this is exposed to an image through a protective film, and has the protective film removed and is developed to form the image on the printing plate. As a generally often adopted preferable method, the precursor of waterless planographic printing plates can also be exposed fully to active light before exposure to an image, then exposed to an ordinary image, treated by a basic treating solution, and developed.

The active light source used for exposure to an image in the present invention can be, for example, a mercury lamp, extra-high pressure mercury lamp, metal halide lamp, xenon lamp or carbon arc lamp, etc.

The developer used in the present invention can be any developer usually proposed for waterless planographic printing plates. Preferable developers include water, a solution obtained by adding a polar solvent to water, a solution obtained by adding any of the following polar solvents or any of the following polar solvents and water to an aliphatic hydrocarbon (hexane, heptane, "Isopar" E, G, H (produced by Esso Kagaku K. K.), gasoline, kerosene, etc.), aromatic hydrocarbon (toluene or xylene, etc.) or a halogenated hydrocarbon (trichlene, etc.), or a polar solvent alone, but the developer which can be used here is not limited to them.

The polar solvents include alcohols (methanol, ethanol, propanol, benzyl alcohol, ethylene glycol monophenyl ether, 2-methoxy ethanol, carbitol monoethrl ether, diethylene glycol monohexyl ether, diethylene glycol mono-2-ethylhexyl ether, triethylene glycol monoethyl ether, dipropylene glycol monomethyl ether, polyethylene glycol monomethyl ether, diethylene glycol, triethylene glycol, dipropylene glycol, polypropylene glycol, 1,3-butanediol, 1,4-butanediol, etc.), ethers (methyl cellosolve, ethyl cellosolve, butyl cellosolve, ethyl carbitol, butyl carbitol, dioxane, etc.), esters (ethyl acetate, methyl lactate, ethyl lactate, butyl lactate, cellosolve acetate, carbitol acetate, dipropylene glycol monomethyl ether, diethyl phthalate, octyl adipate, diethyl adipate, dioctyl phthalate, dioctyl sebacate, etc.), others (triethyl phosphate, etc.), etc.

A solution obtained by adding any of various surfactants such as anionic surfactants, nonionic surfactants, cationic surfactants and amphoteric surfactants, and an alkali, etc. to any of said developers can also be used. The alkalis which can be used here include, for example, inorganic alkalis such as sodium carbonate, sodium silicate, sodium hydroxide, potassium hydroxide and sodium borate, organic amine compounds such as mono-, di- or triethanolamine, mono-, di- or triethylamine, mono-, di- or triisopropanolamine, mono-, di- or triisopropylamine, 2-ethylamino-ethanol, diglycolamine, ethyleneimine and ethylenediimine, etc.

Furthermore, a dye such as Crystal Violet or Asthrazon Red or coupler, etc. can be added to the developer, for dyeing or coloring the image area simultaneously with development. As a further other method, the developed plate can also be immersed in a dyeing solution, for dyeing as posttreatment.

The development can be effected manually or using any known developing unit. It is preferable to use a developing unit consisting of a pretreatment zone, developing zone and posttreatment zone in this order. The developing units which can be used here include, for example, TWL-1160 and TWL-650 produced by Tory Industries, Inc. and developing units disclosed in JP-A-4-2265, 5-2272, 5-6000, etc. Furthermore, these developing units can also be used in a proper combination.

EXAMPLES

The present invention is described below in more detail in reference to examples, but is not limited thereto or thereby.

The tensile property testing method was as follows. The tensile properties of the photosensitive layer were measured according to JIS K 6301. A glass sheet was coated with a photosensitive solution, and after volatilization of the solvent, it was heated to be set at 115° C. From the glass sheet, the photosensitive sheet was peeled, to obtain an about 100-micron thick sheet. From the sheet, 5 mm×40 mm samples were obtained by cutting, and using Tensilon RTM100 (produced by Orienteck K. K.), the initial elastic modulus, 10% stress and elongation at breakage were measured at a tensile speed of 20 cm/min.

Synthesis Example 1
(Synthesis of silyl group-containing quinoneziazide compounds 1)

A partial esterification product (of 36% in the esterification degree by elementary analysis) of 1,2-naphthoquinone-2-diazido-5-sulfonic acid chloride and phenol formaldehyde novolak resin ("Sumilite Resin PR50622" produced by Sumitomo Dures) was dissolved into dry ethylene glycol dimethyl ether, to prepare a 20 wt % solution. To the solution, 30 parts by weight of 3-isocyanatopropyltriethoxysilane were added dropwise per 100 parts by weight of said quinonediazido compound using a dropping funnel under reflux condensing at 60° C. Then, reaction was effected for further 6 hours, to obtain silyl group-containing quinonediazide compound 1.
(Synthesis of quinonediazide group-containing polyurethanes)

Synthesis Example 2

One point zero zero mole (62.10 g) of ethylene glycol, 1.00 mole (168.20 g) of hexamethylene diisocyanate and 923.68 g of DMF (N,N-dimethylformamide) were mixed for reaction at 80° C. for 6 hours. Six hours later, 0.01 mole (0.62 g) of ethylene glycol, for reaction for further 2 hours, to synthesize a hydroxyl group-containing polyurethane.

Forty point zero zero grams of the polyurethane obtained like this, 0.95 g of 1,2-naphthoquinone-2-diazido-5-sulfonic acid chloride and 163.80 g of MEK (methyl ethyl ketone) were mixed, and furthermore 0.20 g of sodium hydrogencarbonate was added, for reaction at 40° C. for 6 hours, to obtain quinonediazide group-containing polyurethane 1.

Synthesis Example 3

One point zero zero mole (62.10 g) of ethylene glycol, 1.00 mole (168.20 g) of hexamethylene diisocyanate and 922.40 g of DMF (N,N-dimethylformamidle) were mixed for reaction at 80° C. for 6 hours. Six hours later, 0.01 mole (0.92 g) of glycerol was added for reaction for further 2 hours, to synthesize a hydroxyl group-containing polyurethane.

Forty point zero zero grams of the polyurethane obtained like this, 0.95 g of 1,2-naphthoquinone-2-diazido-5-sulfonic acid chloride and 163.80 g of MEK (methyl ethyl ketone) were mixed, and furthermore 0.20 g of sodium hydrogencarbonate was added for reaction at 40° C. for 6 hours, to obtain quinonediazide group-containing polyurethane 2.

Synthesis Example 4

A hydroxyl group-containing polyurethane was obtained as described for Synthesis Example 2, except that 1.00 mole (76.09 g) of propylene glycol was used instead of 1.00 mole (62.10 g) of ethylene glycol. The polyurethane was used, to introduce quinonediazide groups according to the reaction as described for Synthesis Example 2, for obtaining quinonediazide group-containing polyurethane 3.

Synthesis Example 5

A hydroxyl group-containing polyurethane was obtained as described for Synthesis Example 2, except that 1.00 mole (250.27 g) of diphenylmethane diisocyanate was used instead of 1.00 mole (168.20 g) of hexamethylene diisocyanate. The polyurethane was used to introduce quinonediazide groups according to the reaction as described for Synthesis Example 2, to obtain quinonediazide group-containing polyurethane 4.

Synthesis Example 6

Reaction was effected as described for Synthesis Example 2, except that 40.00 g of marketed hydroxyl group-containing polyurethane "Sanprene IB-10.4" (produced by Sanyo Chemical Industries, Ltd.) was used, to introduce quinonediazide groups, for obtaining quinonediazide group-containing polyurethane 5.

Synthesis Example 7

Reaction was effected as described for Synthesis Example 2, except that 0.95 g of 1,2-naphthoquinone-2-diazido-4-sulfonic acid chloride was used instead of 0.95 g of 1,2-naphthoquinone-2-diazido-5-sulfonic acid chloride, to introduce quinonediazide groups, for obtaining quinonediazide group-containing polyurethane 6.

Synthesis Example 8

Reaction was effected using the hydroxyl group-containing polyurethane obtained in Synthesis Example 2, as described for Synthesis Example 2, except that 0.78 g of 1,2-benzoquinone-2-diazido-4-sulfonic acid chloride was used instead of 0.95 g of 1,2-naphthoquinone-2-diazido-5-sulfonic acid chloride, to introduce quinonediazide groups, for obtaining quinonediazide group-containing polyurethane 7.

Synthesis Example 9

Reaction was effected as described for Synthesis Example 2, except that 0.48 g of 1,2-naphthoquinone-2-diazido-5-sulfonic acid chloride was used instead of 0.95 g of 1,2-naphthoquinone-2-diazido-5-sulfonic acid chloride, to introduce quinonediazide groups, for obtaining quinonediazide group-containing polyurethane 8.

Synthesis Example 10

Zero point eight zero mole (49.68 g) of ethylene glycol, 1.00 mole (168.20 g) of hexamethylene diisocyanate and 966.60 g of DMF (N,N-dimethylformamilde) were mixed for reaction at 80° C. for 6 hours. Six hours later, 0.21 mole (24.42 g) of hexamethylenediamine was added for reaction for further 2 hours, to synthesize an amino group-containing polyurethane.

Forty point zero zero grams of the polyurethane obtained like this, 0.95 g, of 1,2-naphthoquinone-2-diazido-5-sulfonic acid chloride and 163.80 g of MEK (methyl ethyl ketone) were mixed, and furthermore 0.20 g of sodium hydrogencarbonate was added for reaction at 40° C. for 6 hours, to obtain quinonediazide group-containing polyurethane 9.

Synthesis Example 11

One point zero zero mole (62.10 g) of ethylene glycol, 1.00 mole (168.20 g) of hexamethylene diisocyanate and 927.92 g of DMF (N,N-dimethylformamide) were mixed for reaction at 80° C. for 6 hours. Six hours later, 0.01 mole (1.68 g) of hexamethylene diisocyanate was added for reaction for further 2 hours, to synthesize an isocyanate group-containing polyurethane. To the polyurethane, 0.01 mole (0.62 g) of ethylene glycol was added for reaction for further 2 hours, to synthesize a hydroxyl group-containing polyurethane.

Forty point zero zero grams of the polyurethane obtained like this, 0.95 g of 1,2-naphthoquinone-2-diazido-5-sulfonic acid chloride and 163.80 g of MEK (methyl ethyl ketone) were mixed, and furthermore, 0.20 g of sodium hydrogencarbonate was added for reaction at 40° C. for 6 hours, to obtain quinonediazide group-containing polyurethane 10.

Example 1

A 0.3 mm thick aluminum sheet (produced by Sumitomo Metal Industries;, Ltd.) was coated with the following primer composition using a bar coater, and heat-treated at 200° C. for 2 minutes, to form a 5 μm primer layer.
(a) Polyurethane resin "Miractran P22S" (produced by Nippon Miractran K. K.) 100 parts by weight
(b) Block isocyanate "Takenate B830" (produced by Takeda Chemical Industries, Ltd.) 20 parts by weight
(c) Epoxy.phenol.urea resin "SJ9372" (produced by Kansai Paint Co., Ltd.) 8 parts by weight
(d) Titanium oxide 10 parts by weight
(e) Dibutyltin diacetate 0.5 part by weight
(f) Mono(2-methacryloyloxyethyl) acid phosphate 1 part by weight
(g) Dimethylformamide 725 parts by weight In succession, on the primer layer, the following photosensitive layer composition was applied using a bar coater, and dried in 110° C. air for 1 minute, to form a 1.5 μm thick photosensitive layer.
(a) Partial esterification product of 1,2-naphthoquinone-2-diazido-5-sulfonic acid chloride and phenol formaldehyde novolak resin ("Sumilite Resin" PR50622 produced by Sumitomo Dures, esterification degree 36%, molecular weight 1043) 70 parts by weight
(b) Silyl group-containing quinonediazide compound 1 10 parts by weight
(c) 4,4'-diphenylmethane duisocyanate 21 parts by weight
(d) Quinonediazide group-containing polyurethane 1 30 parts by weight
(e) Dibutyltin diacetate 0.2 part by weight
(f) p-toluenesulfonic acid 0.8 part by weight
(g) Tetrahydrofuran 800 parts by weight Then, on the photosensitive layer, the following silicone rubber composition was applied using a bar coater and wet-heatset at 115° C. at a dew point of 30° C. for 3.5 minutes, to form a 2 μm silicone rubber layer.
(a) Polydimethylsiloxane (molecular weight about 50,000, hydroxyl groups at the ends) 100 parts by weight
(b) Vinyltri(methylethylketoxime)silane 10 parts by weight
(c) "Isopar E" (produced by Exxone Chemicals K. K.) 1400 parts by weight The laminate board obtained as above was laminated with a 10 μm thick polypropylene film "Torayfan" (produced by Toray Industries, Inc.) using a calendar roller, to obtain a precursor of waterless planographic printing plates.

The precursor was fully exposed to a metal halide lamp (Idle Fin 2000 produced by Iwasaki Electric Co., Ltd.) at an illuminance of 11 mW/cm$^2$ measured by a UV meter (Light Measure Type UV-402A produced by Oak Seisakusho) for 6 seconds.

A negative film with a halftone image of 150 lines/inch and a gray scale of 0.15 in optical density difference were kept in vacuum contact with the precursor of printing plates obtained as above, and exposed using said metal halide lamp at a distance of 1 m for 60 seconds.

Then, the cover film of the above exposed plate was removed, and the plate was developed using TWL 1160 (waterless planographic printing plate developing unit produced by Toray Industries, Inc.) at 25° C. and 60% humidity. The pretreating solution used was composed as follows:
(a) Diethylene glycol 80 parts by weight
(b) Diglycolamine 14 parts by weight
(c) Water 6 parts by weight Furthermore, water was used as the developer. The dyeing solution used was composed as follows:
(a) Ethyl carbitol 18 parts by weight
(b) Water 79.9 parts by weight
(c) Crystal Violet 0.1 part by weight
(d) 2-ethylhexanoic acid 2 parts by weight The printing plate discharged from the developing unit was observed, and found to have the silicone rubber layer removed in the portions exposed to the image, for exposing the surface of the photosensitive layer. On the other hand, the non-image area fully exposed and not exposed to the image had the silicone rubber layer firmly remaining. Thus, an image accurately reproducing the negative film was obtained.

Furthermore, in the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" block ink produced by Dainippon Ink & Chemicals, Inc., and good prints reproducing the negative film could be obtained.

The printing durability was 200,000 sheets.

The tensile properties of the photosensitive layer used in this example were measured according to the methods stated before. The initial elastic modulus was 37 kgf/mm$^2$, 10% stress, 1.43 kgf/mm$^2$, and elongation at breakage, 15%.

Example 2

A precursor of waterless planographic printing plates was obtained as described for Example 1, except that the quinoneziazide group-containing polyurethane 2 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon. Ink & Chemicals, Inc., to obtain good prints reproducing the negative film.

The printing durability was 200,000 sheets.

The tensile properties of the photosensitive layer used in this example were measured according to the methods stated before. The initial elastic modulus was 37 kgf/mm$^2$, 10% stress, 1.41 kgf/mm$^2$, and elongation at breaikage, 15%.

Example 3

A precursor of waterless planographic printing plates was obtained as described for Example 1, except that the quinoneziazide group-containing polyurethane 3 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 39 kgf/mm$^2$, 10% stress, 1.51 kgf/mm$^2$, and elongation at breaikage, 13%.

Example 4

A precursor of waterless planographic printing plates was obtained as described for Example 1, except that the quinoneziazide group-containing polyurethane 4 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 41 kgf/mm$^2$, 10% stress, 1.59 kgf/mm$^2$, and elongation at breaikage, 11%.

Example 5

A precursor of waterless planographic printing plates was obtained as described for Example 1, except that the quinoneziazide group-containing polyurethane 5 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was, 40 kgf/mm$^2$, 10% stress, 1.55 kgf/mm$^2$, and elongation at breaikage, 12%.

Example 6

A precursor of waterless planographic printing plates was obtained as described for Example 1, except that the quinoneziazide group-containing polyurethane 6 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 41 kgf/mm$^2$, 1.0% stress, 1.59 kgf/mm$^2$, and elongation at breaikage, 11%.

Example 7

A precursor of waterless planographic printing plates was obtained as described for Example 1, except that the quinoneziazide group-containing polyurethane 7 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 38 kgf/mm$^2$, 10% stress, 1.47 kgf/mm$^2$, and elongation at breaikage, 14%.

Example 8

A precursor of waterless planographic printing plates was obtained tis described for Example 1, except that the quinoneziazide group-containing polyurethane 8 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 39 kgf/mm$^2$, 10% stress, 1.51 kgf/mm$^2$, and elongation at breaikage, 13%.

Example 9

A precursor of waterless planographic printing plates was obtained as described for Example 1, except that the quinoneziazide group-containing polyurethane 9 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had tile silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 41 kgf/mm$^2$, 10% stress, 1.59 kgf/mm$^2$, and elongation at breaikage, 11%.

Example 10

A precursor of waterless planographic printing plates was obtained as described for Example 1, except that the quinoneziazide group-containing polyurethane 10 (30 parts by weight) was used instead of the quinoneziazide group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 39 kgf/mm$^2$, 10% stress, 1.51 kgf/mm$^2$, and elongation at breaikage, 13%.

Example 11

A precursor of waterless planographic printing plates was obtained as described for Example 1, except that a partial esterification product (esterification degree 5%) of 1,2-naphthoquinone-2-diazido-5-sulfonic acid chloride and phenol formaldehyde novolak resin was used instead of the partial esterification product (esterification degree 36%) of 1,2-naphthoquinone-2-diazido-5-sulfonic acid chloride and phenol formaldehyde novolak resin in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 39 kgf/mm$^2$, 10% stress, 1.50 kgf/mm$^2$, and elongation at breaikage, 13%.

Example 12

A precursor of waterless planographic printing plates was obtained as described for Example 1, except that a partial esterification product (esterification degree 65%) of 1,2-naphthoquinone-2-diazido-5-sulfonic acid chloride and phenol formaldehyde novolak resin was used instead of the partial esterification product (esterification degree 36%) of 1,2-naphthoquinone-2-diazido-5-sulfonic acid chloride and phenol formaldehyde novolak resin in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber fly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 42 kgf/mm$^2$, 10% stress, 1.63 kgf/mm$^2$, and elongation at breaikage, 10%.

Example 13

A precursor of waterless planographic printing plates was obtained as described for Example 1, except that a partial esterification product (esterification degree 36%) of 1,2-naphthoquinone-2-diazido-5-sulfonic acid chloride and acetone pyrogallol resin was used instead of 70 parts by weight of the partial esterification product ("Sumilite Resin" PR50622 produced by Sumitomo Dures, esterification degree 36%, molecular weight 1043) of 1,2-naphthoquinone-2-diazido-5-sulfonic acid chloride and phenol formaldehyde novolak resin in the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 39 kgf/mm$^2$, 10% stress, 1.51 kgf/mm$^2$, and elongation at breaikage, 13%.

Example 14

A precursor of waterless planographic printing plates was obtained as described for Example 1, except that a partial esterification product (esterification degree 5%) of 1,2-naphthoquinone-2-diazido-5-sulfonic acid chloride and acetone pyrogallol resin was used instead of the partial esterification product (esterification degree 36%) of 1,2-naphthoquinone-2-diazido-5-sulfonic acid chloride and acetone pyrogallol resin in the photosensitive layer of Example 13. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were, measured according to the methods stated before. The initial elastic modulus was 39 kgf/mm$^2$, 10% stress, 1.50 kgf/mm$^2$, and elongation at breaikage, 13%.

Example 15

A precursor of waterless planographic printing plates was obtained as described for Example 1, except that a partial esterification product (esterification degree 65%) of 1,2-naphthoquinone-2-diazido-5-sulfonic acid chloride and acetone pyrogallol resin was used instead of the partial esterification product (esterification degree 36%) of 1,2-naphthoquinone-2-diazido-5-sulfonic acid chloride and acetone pyrogallol resin in the photosensitive layer of Example 13. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 42 kgf/mm$^2$, 10% stress, 1.63 kgf/mm$^2$, and elongation at breaikage, 10%.

Comparative Example 1

A precursor of waterless printing plates was obtained as described for Example 1, except that the hydroxyl group-containing polyurethane (30 parts by weight) obtained during synthesis of Synthesis Example 2 was used instead of the quinonediazide group-containing polyurethane 1 (30 parts by weight) in the photosensitive layer of Example 1. The waterless planographic printing plate was exposed and developed as described for Example 1, to observe the plate discharged from the developing unit.

When the precursor of waterless planographic printing plates was used soon after it was produced, it showed good performance as achieved in Example 1. However, when the precursor of waterless planographic printing plates was exposed and developed as described for Example 1 after it was stored for a certain period, to observe the plate discharged from the developing unit, the silicone rubber layer in the portions exposed to the image was not partially removed.

In the portions exposed through the gray scale of 0.15 in optical density difference, the silicone rubber layer at the 3rd step was perfectly removed.

Comparative Example 2

A precursor of waterless planographic printing plates was obtained as described for Example 1, except that marketed polyurethane "Sanprene LQ-T1331" (30 parts by weight) (produced by Sanyo Chemical Industries, Ltd.) was used instead of the quinonediazido group-containing polyurethane 1 (30 parts by weight) in the photosensitive layer of Example 1. The waterless planographic printing plate was exposed and developed as described for Example 1, to observe the plate discharged from the developing unit.

The printing plate discharged from the developing unit had the silicone rubber layer removed in the portions exposed to the image, to expose the surface of the photosensitive layer. On the other hand, the non-image area fully exposed but not exposed to the image had the silicone rubber layer firmly remaining, and an image accurately reproducing the negative film could be obtained. The plate was observed by an electron microscope, and found to be poorly formed and unevenly sized in individual halftone dots.

The results of Examples 1 to 15 and Comparative Examples 1 and 2 are shown in Table 1.

TABLE 1

| Sample | GS sensitivity (step) Initial | GS sensitivity (step) After storage | Image reproducibility Initial | Image reproducibility After storage | Form of dots | Printing durability (sheets) |
|---|---|---|---|---|---|---|
| Example 1 | 6 | 6 | ○ | ○ | ○ | 200,000 |
| Example 2 | 6 | 6 | ○ | ○ | ○ | 200,000 |
| Example 3 | 6 | 6 | ○ | ○ | ○ | 200,000 |
| Example 4 | 6 | 6 | ○ | ○ | ○ | 200,000 |
| Example 5 | 6 | 6 | ○ | ○ | ○ | 200,000 |
| Example 6 | 6 | 6 | ○ | ○ | ○ | 200,000 |
| Example 7 | 6 | 6 | ○ | ○ | ○ | 200,000 |
| Example 8 | 6 | 6 | ○ | ○ | ○ | 200,000 |
| Example 9 | 6 | 6 | ○ | ○ | ○ | 200,000 |
| Example 10 | 6 | 6 | ○ | ○ | ○ | 200,000 |
| Example 11 | 6 | 6 | ○ | ○ | ○ | 200,000 |
| Example 12 | 6 | 6 | ○ | ○ | ○ | 200,000 |
| Example 13 | 6 | 6 | ○ | ○ | ○ | 200,000 |
| Example 14 | 6 | 6 | ○ | ○ | ○ | 200,000 |
| Example 15 | 6 | 6 | ○ | ○ | ○ | 200,000 |
| Comparative Example 1 | 6 | 3 | ○ | X | ○ | 200,000 |
| Comparative Example 2 | 6 | 6 | ○ | ○△ | X | 200,000 |

Example 16

A precursor of waterless planographic printing plates was obtained as described for Example 1, except that the amount of the partial esterification product of 1,2-naphthoquinone-2-diazido-5-sulfonic acid chloride and phenol formaldehyde, novolak resin was changed from 70 parts by weight to 50 parts by weight in the photosensitive layer of Example 1 and that the amount of the quinoneziazide group-containing polyurethane 1 was changed from 30 parts by weight to 50 parts by weight. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 30 kgf/mm$^2$, 10% stress, 0.95 kgf/mm$^2$, and elongation at breaikage, 20%.

Example 17

A precursor of waterless planographic printing plates was obtained as described for Example 1, except that the amount of the partial esterification product of 1,2-naphthoquinone-2-diazido-5-sulfonic acid chloride and phenol formaldehyde novolak resin was changed from 70 parts by weight to 30 parts by weight in the photosensitive layer of Example 1 and that 70 parts by weight of the quinonediazide group-containing polyurethane 2 were used instead of 30 parts by weight of the quinoneziazide group-containing polyurethane 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 20 kgf/mm$^2$, 10% stress, 0.65 kgf/mm$^2$, and elongation at breaikage, 30%.

Example 18

A precursor of waterless planographic printing plates was obtained as described for Example 1, except that marketed polyurethane "Sanprene LQ-T1331" (20 parts by weight) (produced by Sanyo Chemical Industries, Ltd.) was added to the photosensitive layer of Example 1. The waterless planographic printing plate was exposed and developed as described for Example 1, to observe the plate discharged from the developing unit.

The printing plate discharged from the developing unit had the silicone rubber layer removed to expose the surface of the photosensitive layer. On the other hand, the non-image area fully exposed and not exposed to the image had the silicone rubber firmly remaining, and an image accurately reproducing the negative film could be obtained.

In the portions exposed through the gray scale of 0.15 in optical density difference, the silicone rubber layer at the 6th step was perfectly removed.

The obtained printing plate was installed in an offset press (Komori Sprint Four-Color Machine), and wood-free paper was printed using "Dry-o-color" black ink produced by Dainippon Ink & Chemicals, Inc., to obtain good prints reproducing the negative film.

The printing durability was 200,000 sheets.

The tensile properties of the photosensitive layer used in this example were measured according to the methods stated before. The initial elastic modulus was 25 kgf/mm$^2$, 10% stress, 0.74 kgf/mm$^2$, and elongation at breaikage, 25%.

Comparative Example 3

A precursor of waterless planographic printing plates was obtained as described for Example 1, except that marketed polyurethane "Sanprene LQ-T1331" (50 parts by weight) (produced by Sanyo Chemical Industries, Ltd.) was used instead of the quinonediazide group-containing polyurethane 1 (50 parts by weight) in the photosensitive layer of Example 12. The waterless planographic printing plate was exposed and developed as described for Example 1, to observe the plate discharged from the developing unit.

The printing plate discharged from the developing unit had the silicone rubber layer removed at the portions exposed to the image, to expose the surface of the photosensitive layer. On the other hand, the non-image area fully exposed and not exposed to the image had the silicone rubber layer firmly remaining, and an image accurately reproducing the negative film could be obtained. However, when the plate was observed by an electron microscope, the individual halftone dots were found to be poorly formed and unevenly sized. The precursor of waterless planographic printing plates which had been stored for a certain period was exposed and developed as described for Example 1, to observe the plate discharged from the developing unit. It was found that the silicone rubber layer at the portions exposed to the image were not partially removed.

The results of Examples 16 to 18 and Comparative Example 3 are shown in Table 2.

TABLE 2

| Sample | GS sensitivity (step) | | Image reproducibility | | Form of dots | Printing durability (sheets) |
| --- | --- | --- | --- | --- | --- | --- |
| | Initial | After storage | Initial | After storage | | |
| Example 16 | 6 | 6 | ○ | ○ | ○ | 200,000 |
| Example 17 | 6 | 6 | ○ | ○ | ○ | 200,000 |
| Example 18 | 6 | 6 | ○ | ○ | ○ | 200,000 |
| Comparative Example 3 | 6 | 6 | ○ | Δ | X | 200,000 |

Example 19

A precursor of waterless planographic printing plates was obtained as described for Example 1, except that carbon black "RAVEN 1255" (produced by Columbia Carbon Nihon K.K.) was added by 5 parts by weight to the photosensitive layer of Example 1.

The precursor was fully exposed as described for Example 1. The obtained precursor of printing plates was exposed as described for Example 1.

Then, the exposed plate was developed as described for Example 1.

The printing plate discharged from the developing unit was observed and found to have the silicone rubber layer removed at the portions exposed to the image, to expose the surface of the photosensitive layer. On the other hand, the non-image area fully exposed but not exposed to the image had the silicone rubber layer firmly remaining, and an image accurately reproducing the negative film could be obtained.

In the portions exposed through the gray scale of 0.15 in optical density difference, the silicone rubber layer at the 6th stage was perfectly removed.

Furthermore, the precursor of printing plates obtained in Example 19 was exposed fully as described for Example 1. The precursor was pulse-exposed using semiconductor laser (OPC-A001-mmm-FC, output 0.75 W, wavelength 780 nm, produced by Opto Power Corporation) mounted on an X-Y table at a beam diameter of 20 μm at an output of 50 mW on the surface of the printing plate for 10 μs.

Then, the cover film of the exposed plate was removed, and the plate was developed as described for Example 1. The printing plate discharged from the developing unit was observed and found to have the silicone rubber layer removed in the pulse-exposed 20 μm diameter portions, to expose the surface of the photosensitive layer in the 20 μm diameter portions. On the other hand, the non-image area fully exposed but not exposed to the image had the silicone rubber layer firmly remaining, and a waterless planographic printing plate accurately reproducing the pulse exposure pattern could be obtained.

The obtained two printing plates were installed in an offset press (Komori Sprint Four-Color Machine), and wood-free paper was printed using "Dry-o-color" black ink produced by Dainippon Ink & Chemicals, Inc., to obtain good prints.

The printing durability was 200,000 sheets.

The tensile properties of the photosensitive layer used in this example were measured according to the methods stated before. The initial elastic modulus we 45 kgf/mm$^2$, 10% stress, 1.65 kgf/mm$^2$, and elongation at breaikage, 11%.

Example 20

A precursor of waterless planographic printing plates was obtained as described for Example 1, except that Spirit Nigrosine (produced by Dye Specialities, Inc.) was added by 5 parts by weight to the photosensitive layer of Example 1.

The precursor was fully exposed as described for Example 1. The obtained precursor of printing plates was exposed as described for Example 1.

Then, the exposed plate was developed as described for Example 1.

The printing plate discharged from the developing unit was observed and found to have the silicone rubber layer removed at the portions exposed to the image, to expose the surface of the photosensitive layer. On the other hand, the non-image area fully exposed but not exposed to the image had the silicone rubber layer firmly remaining, and an image accurately reproducing the negative film could be obtained.

In the portions exposed through the gray scale of 0.15 in optical density difference, the silicone rubber layer at the 6th stage was perfectly removed.

Furthermore, the precursor of printing plates obtained in Example 20 was exposed fully as described for Example 1. The precursor was pulse-exposed using a semiconductor laser (OPC-A001-mmm-FC, output 0.75 W, wavelength 780 nm, produced by Opto Power Corporation) mounted on an X-Y table at a beam diameter of 20 μm at an output of 50 mW on the surface of the printing plate for 10 μs.

Then, the cover film of the exposed plate was removed, and the plate was developed as described for Example 1. The printing plate discharged from the developing unit was observed and found to have the silicone rubber layer removed in the pulse-exposed 20 μm diameter portions, to expose the surface of the photosensitive layer in the 20 μm diameter portions. On the other hand, the non-image area fully exposed but not exposed to the image had the silicone rubber layer firmly remaining, and a waterless lithographic printing plate accurately reproducing the pulse exposure pattern could be obtained.

The obtained two printing plates were installed in an offset press (Komori Sprint Four-Color Machine), and wood-free paper was printed using "Dry-o-color" black ink produced by Dainippon Ink & Chemicals, Inc., to obtain good prints.

The printing durability was 200,000 sheets.

The tensile properties of the photosensitive layer used in this example were measured according to the methods stated before. The initial elastic modulus was 40 kgf/mm², 10% stress, 1.55 kgf/mm², and elongation at breaikage, 12%.

Example 21

A precursor of waterless planographic printing plates was obtained as described for Example 1, except that cyanine dye, IR-140 (maximum absorption wavelength 823 nm, e=156000) was added by 5 parts by weight to the photosensitive layer of Example 1.

The precursor was fully exposed as described for Example 1. The obtained precursor of printing plates was exposed as described for Example 1.

Then, the exposed plate was developed as described for Example 1.

The printing plate discharged from the developing unit was observed and found to have the silicone rubber layer removed at the portions exposed to the image, to expose the surface of the photosensitive layer. On the other hand, the non-image area fully exposed but not exposed to the image had the silicone rubber layer firmly remaining, and an image accurately reproducing the negative film could be obtained.

In the portions exposed through the gray scale of 0.15 in optical density difference, the silicone rubber layer at the 6th stage was perfectly removed.

Furthermore, the precursor of printing plates obtained in Example 21 was exposed fully as described for Example 1. The precursor was pulse-exposed using a semiconductor laser (OPC-A001-mmm-FC, output 0.75 W, wavelength 780 nm, produced by Opto Power Corporation) mounted on an X-Y table at a beam diameter of 20 µm at an output of 50 mW on the surface of the printing plate for 10 µs.

Then, the cover film of the exposed plate was removed, and the plate was developed as described for Example 1. The printing plate discharged from the developing unit was observed and found to have the silicone rubber layer removed in the pulse-exposed 20 µm diameter portions, to expose the surface of the photosensitive layer in the 20 µm diameter portions. On the other hand, the non-image area fully exposed but not exposed to the image had the silicone rubber layer firmly remaining, and a waterless planographic printing plate accurately reproducing the pulse exposure pattern could be obtained.

The obtained two printing plates were installed in an offset press (Komori Sprint Four-Color Machine), and wood-free paper was printed using "Dry-o-color" black ink produced by Dainippon Ink & Chemicals, Inc., to obtain good prints.

The printing durability was 200,000 sheets.

The tensile properties of the photosensitive layer used in this example were measured according to the methods stated before. The initial elastic modulus was 42 kgf/mm², 10% stress, 1.58 kgf/mm², and elongation at breaikage, 13%.

Example 22

A precursor of waterless planographic printing plates was obtained as described for Example 1, except that polymethine based infrared light absorbent, "Kayasorb" IR-820(B) (produced by Nippon Kayaku Co., Ltd.) was added by 5 parts by weight to the photosensitive layer of Example 1.

The precursor was fully exposed as described for Example 1. The obtained precursor of printing plates was exposed as described for Example 1.

Then, the exposed plate was developed as described for Example 1.

The printing plate discharged from the developing unit was observed and found to have the silicone rubber layer removed at the portions exposed to the image, to expose the surface of the photosensitive layer. On the other hand, the non-image area fully exposed but not exposed to the image had the silicone rubber layer firmly remaining, and an image accurately reproducing the negative film could be obtained.

In the portions exposed through the gray scale of 0.15 in optical density difference, the silicone rubber layer at the 6th stage was perfectly removed.

Furthermore, the precursor of printing plates obtained in Example 22 was exposed fully as described for Example 1. The precursor was pulse-exposed using a semiconductor laser (OPC-A001-mmm-FC, output 0.75 W, wavelength 780 nm, produced by Opto Power Corporation) mounted on an X-Y table at a beam diameter of 20 µm at an output of 50 mW on the surface of the printing plate for 10 µs.

Then, the cover film of the exposed plate was removed, and the plate was developed as described for Example 1. The printing plate discharged from the developing unit was observed and found to have the silicone rubber layer removed in the pulse-exposed 20 µm diameter portions, to expose the surface of the photosensitive layer in the 20 µm diameter portions. On the other hand, the non-image area fully exposed but not exposed to the image had the silicone rubber layer firmly remaining, and a waterless planographic printing plate accurately reproducing the pulse exposure pattern could be obtained.

The obtained two printing plates were installed in an offset press (Komori Sprint Four-Color Machine), and wood-free paper was printed using "Dry-o-color" black ink produced by Dainippon Ink & Chemicals, Inc., to obtain good prints.

The printing durability was 200,000 sheets.

The tensile properties of the photosensitive layer used in this example were measured according to the methods stated before. The initial elastic modulus was 39 kgf/mm², 10% stress, 1.52 kgf/mm², and elongation at breaikage, 13%.

INDUSTRIAL APPLICABILITY

The present invention can provide a precursor of waterless lithographic printing plates, which is remarkably improved in both image reproducibility and printing durability without being lowered in developability, printability and solvent resistance, and which can be used for both the method of obtaining a waterless planographic printing plate by ordinary image exposure and the method of obtaining a waterless planographic printing plate by laser irradiation.

What is claimed is:

1. A precursor of waterless planographic printing plates, in which at least a photosensitive layer and a silicone rubber layer are laminated on a substrate in this order, characterized in that said photosensitive layer contains a quinonediazide group-containing polyurethane resin.

2. A precursor of waterless planographic printing platess according to claim 1, wherein said photosensitive layer contains a quinonediazide compound other than a quinonediazide group-containing polyurethane resin.

3. A precursor of waterless planographic printing platess according to claim 2, wherein the quinonediazide compound is a quinonediazide group-containing phenol formaldehyde novolak resin or a quinonediazide group-containing acetone pyrogallol resin.

4. A precursor of waterless planographic printing platess according to claim 1, wherein the quinonediazide group-containing polyurethane resin is a reaction product of a hydroxyl group-containing polyurethane resin and a quinonediazide compound.

5. A precursor of waterless planographic printing platess according to claim 1, wherein the polyurethane resin containing quinonediazide groups is a reaction product of an isocyanate group-containing polyurethane resin and a quinonediazide compound.

6. A precursor of waterless planographic printing platess according to claim 1, wherein the polyurethane resin containing quinonediazide groups further contains hydroxyl groups.

7. A precursor of waterless planographic printing platess according to claim 2, wherein said photosensitive layer contains a light-heat converting material.

8. A precursor of waterless planographic printing platess according to claim 7, wherein the light-heat converting material is carbon black.

9. A precursor of waterless planographic printing platess according to claim 7, wherein the light-heat converting material is a dye.

10. A precursor of waterless planographic printing platess according to claim 9, wherein the dye is a methine based dye and/or a polymethine based dye.

11. A precursor of waterless planographic printing platess according to claim 9, wherein the dye is a nigrosine based dye.

12. A precursor of waterless planographic printing platess according to claim 1, wherein said photosensitive layer has an initial elastic modulus of 5 to 75 $kgf/mm^2$ after exposure.

13. A precursor of waterless planographic printing platess according to claim 1, wherein said photosensitive layer has a crosslinked structure.

14. A waterless planographic printing plate obtained by irradiating the precursor of waterless planographic printing plate of claim 1 with active light and developing said precursor.

15. A waterless planographic printing plate obtained by irradiating the precursor of waterless planographic printing plates of claim 7 with active light having a wavelength of 500 to 1300 nm and developing said precursor.

* * * * *